United States Patent
Lee et al.

(10) Patent No.: US 7,109,805 B2
(45) Date of Patent: Sep. 19, 2006

(54) DIRECT MODULATOR FOR SHIFT KEYING MODULATION

(75) Inventors: Chang-Hyeon Lee, Irvine, CA (US); Hoon Lee, Irvine, CA (US); Akbar Ali, Garden Grove, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/902,746

(22) Filed: Jul. 29, 2004

(65) Prior Publication Data

US 2006/0022758 A1     Feb. 2, 2006

(51) Int. Cl.
*H03L 7/00* (2006.01)
*H03C 3/06* (2006.01)
*H03M 3/00* (2006.01)

(52) U.S. Cl. .................. 331/23; 332/128; 341/143
(58) Field of Classification Search ............... 331/23; 332/128
See application file for complete search history.

(56) References Cited

U.S. PATENT DOCUMENTS 5,130,676 A * 7/1992 Mutz ..................... 332/100
6,008,703 A * 12/1999 Perrott et al. ............ 332/100

* cited by examiner

*Primary Examiner*—Joseph Chang

(57) ABSTRACT

A system for direct modulation is disclosed. Embodiments of the direct modulator for shift-keying modulation include impressing baseband data on a radio frequency (RF) signal at an oscillator by controlling a digital divider using a sigma-delta modulator.

23 Claims, 5 Drawing Sheets

DIRECT MODULATOR FOR SHIFT KEYING MODULATION

BACKGROUND OF THE INVENTION

1. Field of the Invention

This invention relates generally to a modulation system for a wireless transmitter more particularly, the invention relates to a direct modulator for a wireless transmitter.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld, telephone-like communication handset, also referred to as a portable transceiver. The different modulation and transmission schemes each have advantages and disadvantages.

As these mobile communication systems have been developed and deployed, many different standards have evolved, to which these systems must conform. For example, in the United States, many portable communications systems comply with the IS-136 standard, which requires the use of a particular modulation scheme and access format. In the case of IS-136, the modulation scheme is narrow band offset π/4 differential quadrature phase shift-keying (π/4-DQPSK), and the access format is TDMA.

In Europe, the global system for mobile communications (GSM) standard requires the use of the gaussian minimum shift-keying (GMSK) modulation scheme in a narrow band TDMA access environment, which uses a constant envelope modulation methodology. Other modulation formats use minimum shift keying (MSK), frequency shift-keying (FSK) and other shift-keying modulation methodologies.

Furthermore, in a typical GSM mobile communication system using narrow band TDMA technology, a GMSK modulation scheme supplies a low noise phase modulated (PM) transmit signal to a non-linear power amplifier directly from an oscillator. In such an arrangement, a highly efficient, non-linear power amplifier can be used thus allowing efficient modulation of the phase-modulated signal and minimizing power consumption. Because the modulated signal is supplied directly from an oscillator, the need for filtering, either before or after the power amplifier, is minimized. Further, the output in a GSM transceiver is a constant envelope (i.e., a non time-varying amplitude) modulation signal.

The current GSM mobile communication system employs a modulation format that converts the transmit signal to an intermediate frequency (IF) before upconversion to radio frequency (RF). In such a system, one or more mixers and frequency sources (oscillators), are used to perform the upconversion. Unfortunately, these components are costly, consume significant power, consume a significant amount of area on the device, and typically require an "off-chip" filter to tune the mixer.

Furthermore, regardless of the type of modulation methodology employed, as virtually all of these portable communication devices operate using a rechargeable power source, such as a battery, it is desirable to minimize the amount of power consumed by the portable communication device so that the operating time of the portable communication device may be maximized.

In the portable transceiver, the oscillator that is used to develop a signal at a particular frequency that is used to convert the transmit signal from baseband to the proper transmit frequency, and to convert the frequency of a received signal to a baseband signal, consumes a significant amount of power. The oscillator generates what is referred to as a "local oscillator" signal, or "LO" signal. Such an oscillator may be what is referred to as a "voltage controlled oscillator," or "VCO," a current controlled oscillator (CCO), or another type of oscillator. A VCO develops a desired frequency based upon a voltage signal supplied to a bias port of the VCO. Further, the LO path typically includes at least one voltage gain amplifier.

In systems that use an IF transmit signal, the VCO is used to provide the local oscillator and another VCO is used to upconvert the transmit signal to RF. Further, a mixer is typically used to generate the in-phase (I) and quadrature (Q) components of the transmit signal. Unfortunately, the mixer, the IF VCO, and the voltage gain amplifier consume significant power.

In systems that use a direct upconversion methodology, many of the components are implemented using passive analog elements, which are susceptible to pole/zero location mismatch and impedance mismatch caused by manufacturing process and temperature variations. These analog elements are typically located in the phase locked loop (PLL) that is part of the upconverter.

Therefore it would be desirable to reduce the power consumption of the modulator, while allowing direct upconversion of the transmit signal from baseband to RF, while also minimizing pole/zero location mismatch between passive loop filter components in the PLL and digital data pre-emphasis data.

SUMMARY

Embodiments of the direct modulator for shift-keying modulation include using a sigma-delta modulator (SDM) to control a divider to directly modulate an RF signal using baseband information supplied by a digital signal processor (DSP). In one embodiment, the invention is a system for impressing baseband data on a radio frequency (RF) signal at an oscillator by controlling a digital divider using a sigma-delta modulator.

Related methods of operation are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 1:
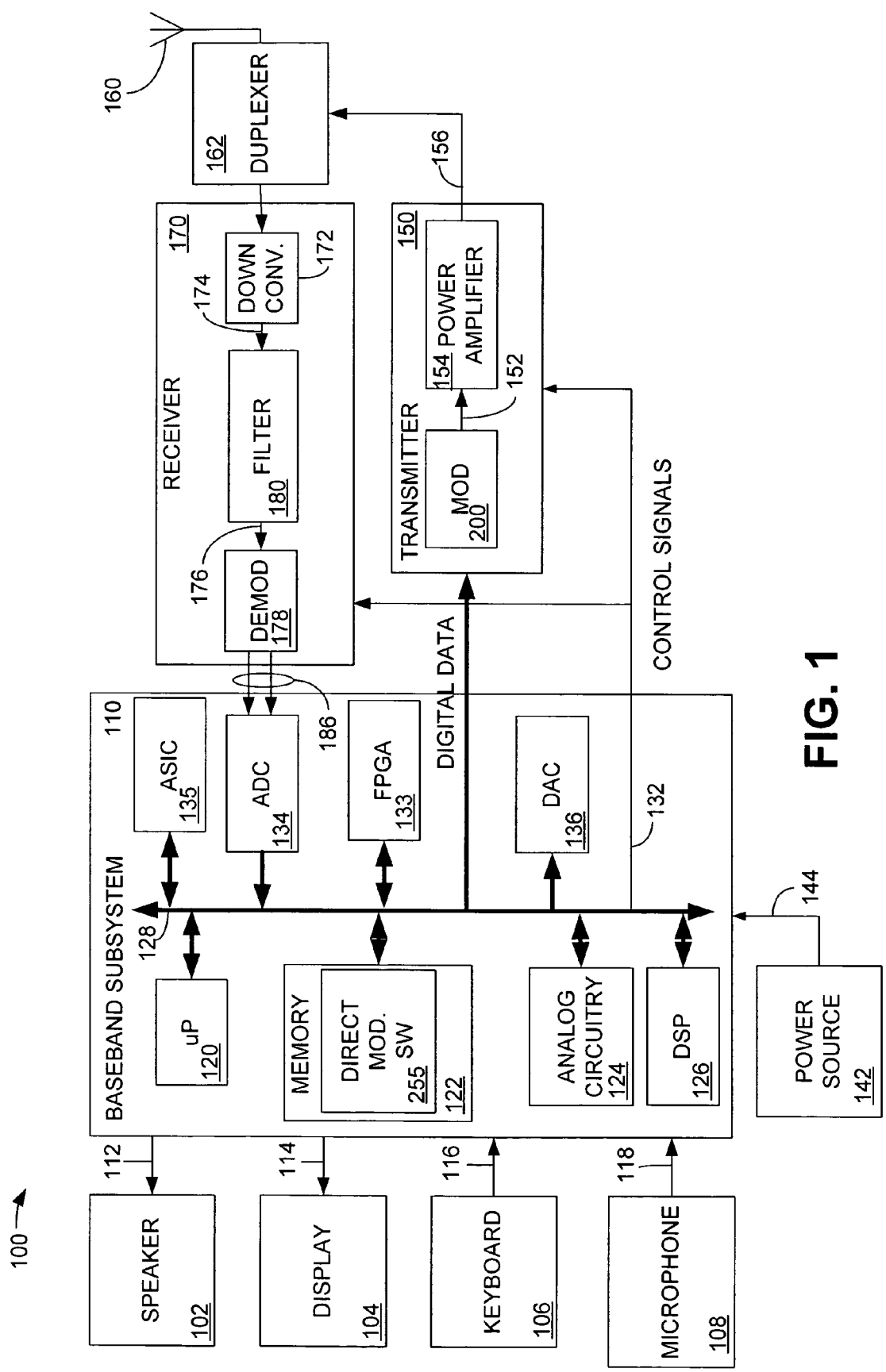
FIG. 1 is a block diagram illustrating a simplified portable transceiver.

Although described with particular reference to a portable transceiver, the direct modulator for shift-keying modulation can be implemented in any system that uses a shift-keying modulation scheme in a direct upconversion transmitter. For example, the direct modulator for shift-keying modulation can be used in any wireless transmitter, such as, for example, a so-called "Bluetooth" transmitter.

The direct modulator for shift-keying modulation can be implemented in software, hardware, or a combination of software and hardware. In a preferred embodiment, the direct modulator for shift-keying modulation may be implemented using a combination of hardware and software. The hardware can be implemented using specialized hardware elements and logic. The software portion of the direct modulator for shift-keying modulation can be stored in a memory and be executed by a suitable instruction execution system (e.g., microprocessor). The hardware implementation of the direct modulator for shift-keying modulation can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc. The hardware can be implemented using, for example, complementary metal oxide semiconductor (CMOS), bi-polar CMOS (BiCMOS) or other processing technologies.

The software of the direct modulator for shift-keying modulation comprises an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100 including a direct modulator for shift-keying modulation. The portable transceiver 100 includes speaker 102, display 104, keyboard 106, and microphone 108, all connected to baseband subsystem 110. A power source 142, which may be a direct current (DC) battery or other power source, is also connected to the baseband subsystem 110 via connection 144 to provide power to the portable transceiver 100. In a particular embodiment, portable transceiver 100 can be, for example but not limited to, a portable telecommunication device such as a mobile cellular-type telephone. Speaker 102 and display 104 receive signals from baseband subsystem 110 via connections 112 and 114, respectively, as known to those skilled in the art. Similarly, keyboard 106 and microphone 108 supply signals to baseband subsystem 110 via connections 116 and 118, respectively. Baseband subsystem 110 includes microprocessor (μP) 120, memory 122, analog circuitry 124, and digital signal processor (DSP) 126 in communication via bus 128. Bus 128, although shown as a single bus, may be implemented using multiple busses connected as necessary among the subsystems within baseband subsystem 110.

Depending on the manner in which the direct modulator for shift-keying modulation is implemented, the baseband subsystem 110 may also include an application specific integrated circuit (ASIC) 135 and a field programmable gate array (FPGA) 133.

Microprocessor 120 and memory 122 provide the signal timing, processing and storage functions for portable transceiver 100. Analog circuitry 124 provides the analog processing functions for the signals within baseband subsystem 110. Baseband subsystem 110 provides control signals to transmitter 150 and receiver 170 via connection 132. Although shown as a single connection 132, the control signals may originate from the DSP 126, the ASIC 135, the FPGA 133, or from microprocessor 120, and are supplied to a variety of connections within the transmitter 150 and the receiver 170. It should be noted that, for simplicity, only the basic components of portable transceiver 100 are illustrated herein. The control signals provided by the baseband subsystem 110 control the various components within the transmitter 150 and the receiver 170.

If portions of the direct modulator for shift-keying modulation are implemented in software that is executed by the microprocessor 120, the memory 122 typically will also include the direct modulation software 255. The direct modulation software 255 comprises one or more executable code segments that can be stored in the memory and executed in the microprocessor 120. Alternatively, the functionality of the direct modulation software 255 can be coded into the ASIC 135 or can be executed by the FPGA 133. Because the memory 122 can be rewritable and because the FPGA 133 is reprogrammable, updates to the direct modulation software 255 can be remotely sent to and saved in the portable transceiver 100 when implemented using either of these methodologies.

Baseband subsystem 110 also includes analog-to-digital converter (ADC) 134 and digital-to-analog converter (DAC) 136. ADC 134 and DAC 136 also communicate with microprocessor 120, memory 122, analog circuitry 124 and DSP 126 via bus 128.

The transmitter 150 includes direct modulator 200, which modulates digital baseband information received from the DSP 126 via the bus 128, upconverts the modulated signal to a radio frequency (RF) level and provides a modulated RF signal via connection 152 to the power amplifier 154. The operation of the direct modulator 200 will be described in greater detail below.

The power amplifier 154 supplies the RF signal via connection 156 to duplexer 162. The duplexer 162 comprises a filter pair that allows simultaneous passage of both transmit signals and receive signals, as known to those having ordinary skill in the art. The transmit signal is supplied from the duplexer 162 to the antenna 160.

A signal received by antenna 160 will be directed from the duplexer 162 to the receiver 170. The receiver 170 includes a downconverter 172, a filter 180 and a demodulator 178. The downconverter 172 generally includes a low-noise amplifier (LNA) (not shown) and circuitry (not shown) to convert the received signal from an RF level to a baseband level (DC), either through an intermediate frequency (IF) or directly to baseband if the receiver is a so called "direct conversion" receiver.

The demodulator 178 recovers the transmitted analog information and supplies a signal representing this information via connection 186 to ADC 134. ADC 134 converts these analog signals to a digital signal at baseband frequency and transfers the signal via bus 128 to DSP 126 for further processing.

Figure 2:
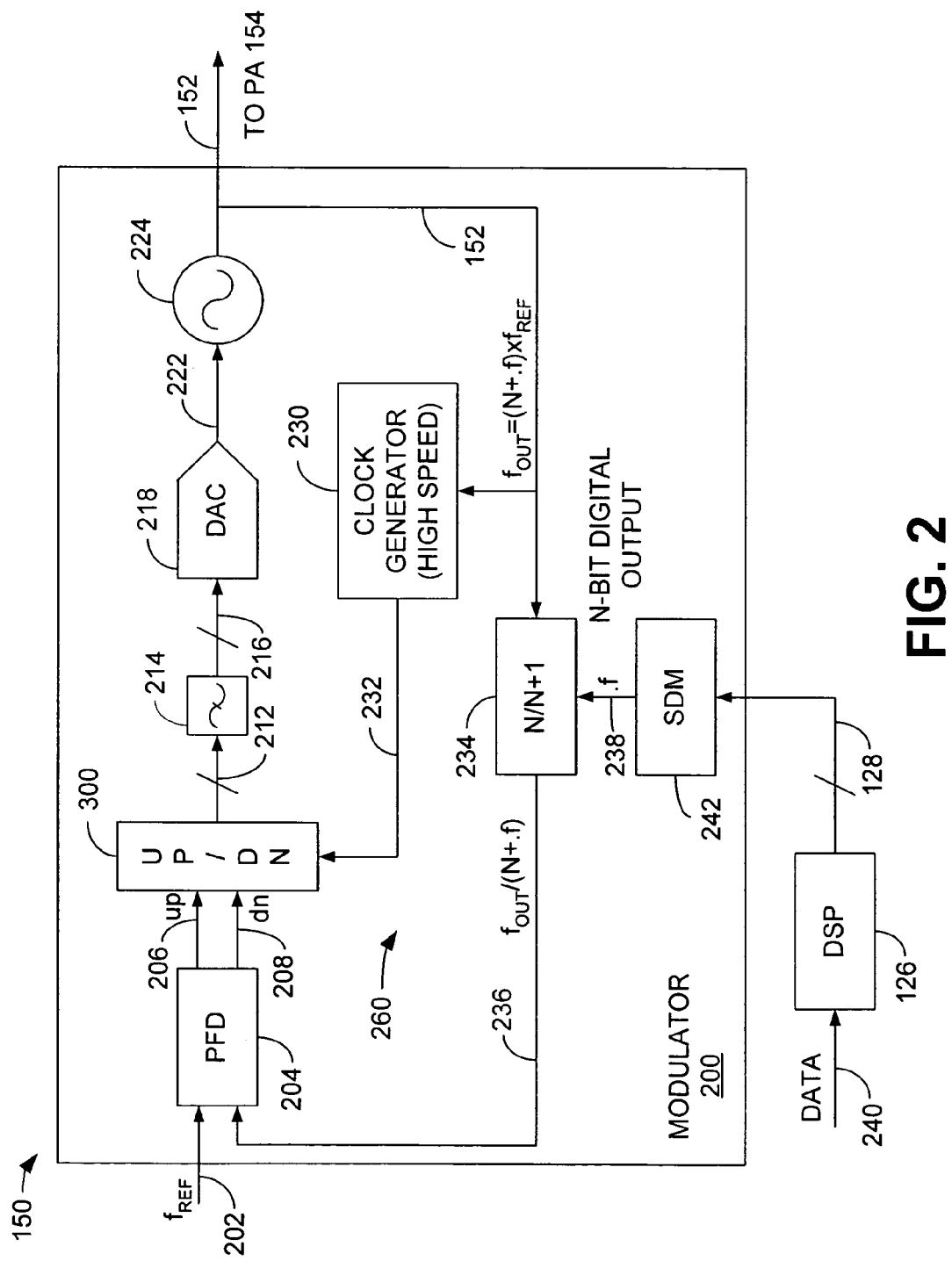
FIG. 2 is a block diagram illustrating a direct modulator of FIG. 1.

FIG. 2 is a block diagram illustrating a direct modulator 200 of FIG. 1. The direct modulator 200 is sometimes referred to as a "direct launch" modulator because it develops the RF transmit signal without first upconverting the baseband data to an IF level signal. The direct modulator 200 comprises a phase frequency detector (PFD) 204, which receives a reference frequency ($f_{REF}$) on connection 202. The phase frequency detector 204 can be, for example, a tri-state phase frequency detector as known in the art. The phase frequency detector 204 also receives a feedback input from a divider 234 via connection 236. The divider 234 will be described below. The phase frequency detector 204 detects the phase/frequency difference between the reference signal on connection 202 and the feedback signal on connection 236 and provides outputs on connections 206 and 208, respectively. The output on connection 206 is referred to as the "up" output and the output on connection 208 is referred to as the "dn" output. If the reference signal is faster than the feedback signal, then the "up" signal is output from the PFD 204 on connection 206. If the reference signal is slower than the feedback signal, then the "dn" signal is output from the PFD 204 on connection 208. The outputs on connections 206 and 208 are each a digital bit stream comprising a pulse train that is used to control the frequency of the direct modulator 200.

The signals on connections 206 and 208 are supplied to an up/down counter 300. The up/down counter 300 measures the pulse width of the up signal on connection 206 and the pulse width of the down signal on connection 208 and integrates these values over one reference cycle. The output of the up/down counter 300 is the average pulse width of the signals on connections 206 and 208 over one reference cycle. The up/down counter quantizes the phase error represented by the up and down signals on connections 206 and 208. The clock frequency used by the up/down counter 300 can be a multiple integer number of the reference frequency ($f_{REF}$) on connection 202 to minimize quantization error that may occur between the difference of the output of the sigma-delta modulator 242 (to be described below) and the reference frequency ($f_{REF}$). In this example, the clock frequency used by the up/down counter 300 is eight (8) times the reference frequency ($f_{REF}$).

In one embodiment, the up/down counter 300 can be implemented using, for example, an oversampled pulse-width detector (OSPD), which will be described in greater detail with respect to FIG. 3. The output of the up/down counter 300 is a digital bit stream and is supplied via connection 212 to a digital loop filter 214.

The digital loop filter 214 receives the output of the up/down counter 300 on connection 212 and stabilizes the output of the up/down counter 300 (and the entire phase locked loop (PLL) 260, or alternatively, a delay locked loop (DLL)), defined by the sigma-delta modulator 242 and the divider 234.

The output of the digital loop filter 214 is supplied via connection 216 to a DAC 218. The DAC 218 transforms the digital bit stream on connection 216 to an analog signal on connection 222 that is used to control the output frequency of an oscillator 224. The oscillator can be, for example, a voltage controlled oscillator (VCO), a current controlled oscillator (CCO), or any other oscillator. The output of the oscillator 224 is supplied via connection 152 to the power amplifier 154 (FIG. 1). The output of the oscillator 224 is also supplied as a feedback signal to both a clock generator 230 and to the divider 234. In this example, the clock generator 230 generates a clock signal on connection 232 having a frequency that is a multiple integer number of the reference frequency $f_{REF}$. The output of the clock generator 230 is supplied via connection 232 to the up/down counter 300.

The output, $f_{OUT}$, of the oscillator 224 is also supplied to the divider 234. In this example, the divider 234 can be what is referred to as a "fractional N synthesizer," or a "fractional divider."

Binary baseband transmit data is supplied via connection 240 to the DSP 126 (FIG. 1). The data is processed by the DSP 126 and supplied via connection 128 to the sigma-delta modulator 242. The sigma-delta modulator 242 generates a randomized bitstream or digital word, which, in this embodiment, is a three bit digital value supplied via connection 238 to the divider 234. The randomized bitstream developed by the sigma-delta modulator 242 includes the transmit data supplied by the DSP 126.

The frequency of the signal output from the VCO 224 on connection 152 can be referred to as the nominal frequency value, $f_{OUT}$. The output of the sigma-delta modulator on connection 242 is an N bit digital output that changes the nominal value of $f_{OUT}$ by an amount equal to the digital word and is referred to as ".f". The value of ".f" determines the instantaneous value "N" supplied by the divider 234 as feedback on connection 236 to the PFD 204. The output of the oscillator 224 on connection 152 is given by Equation 1.

$$f_{OUT} = (N + .f) \times f_{REF} \qquad \text{Equation 1}$$

The output frequency of the divider 234 is $f_{OUT}/(N+.f)$ and is supplied via connection 236 to the phase frequency detector 204. The sigma-delta modulator 242 and the divider 234 form the PLL 260 that is used to impress the baseband transmit data from the DSP 126 onto the RF signal at the oscillator 224 by controlling the divider 234 using the output of the sigma-delta modulator 242. Because the PLL 260, the digital loop filter 214 and the DSP 126 are all digital circuits, the problem of pole/zero location mismatch between passive loop filter components and DSP digital pre-emphasis data is effectively eliminated and the effects of temperature and process variations are minimized.

The digital output of the divider 234 is used to determine the channel frequency and is used to control the instantaneous frequency and phase of the PLL 260. As a result, in-phase (I) and quadrature (Q) mixing is not required. The desired transmit signal is generated directly at a radio frequency level with no intermediate frequency (IF) conversion. The sigma-delta modulator 242 generates a bit stream by adding reference data to the transmit data. Thus, the output of the divider 234 includes baseband data information without requiring mixing or a local oscillator input.

The term ".f" is, in this example, the 3-bit digital output supplied by the sigma-delta modulator 242 to the divider 234. As shown, the output of the sigma-delta modulator 242 modifies the nominal value N to provide the feedback signal on connection 236 to the phase frequency detector 204. In this manner, baseband data is impressed on the RF signal at the oscillator by controlling the divider 234 using the output of the sigma-delta modulator 242.

Figure 3:
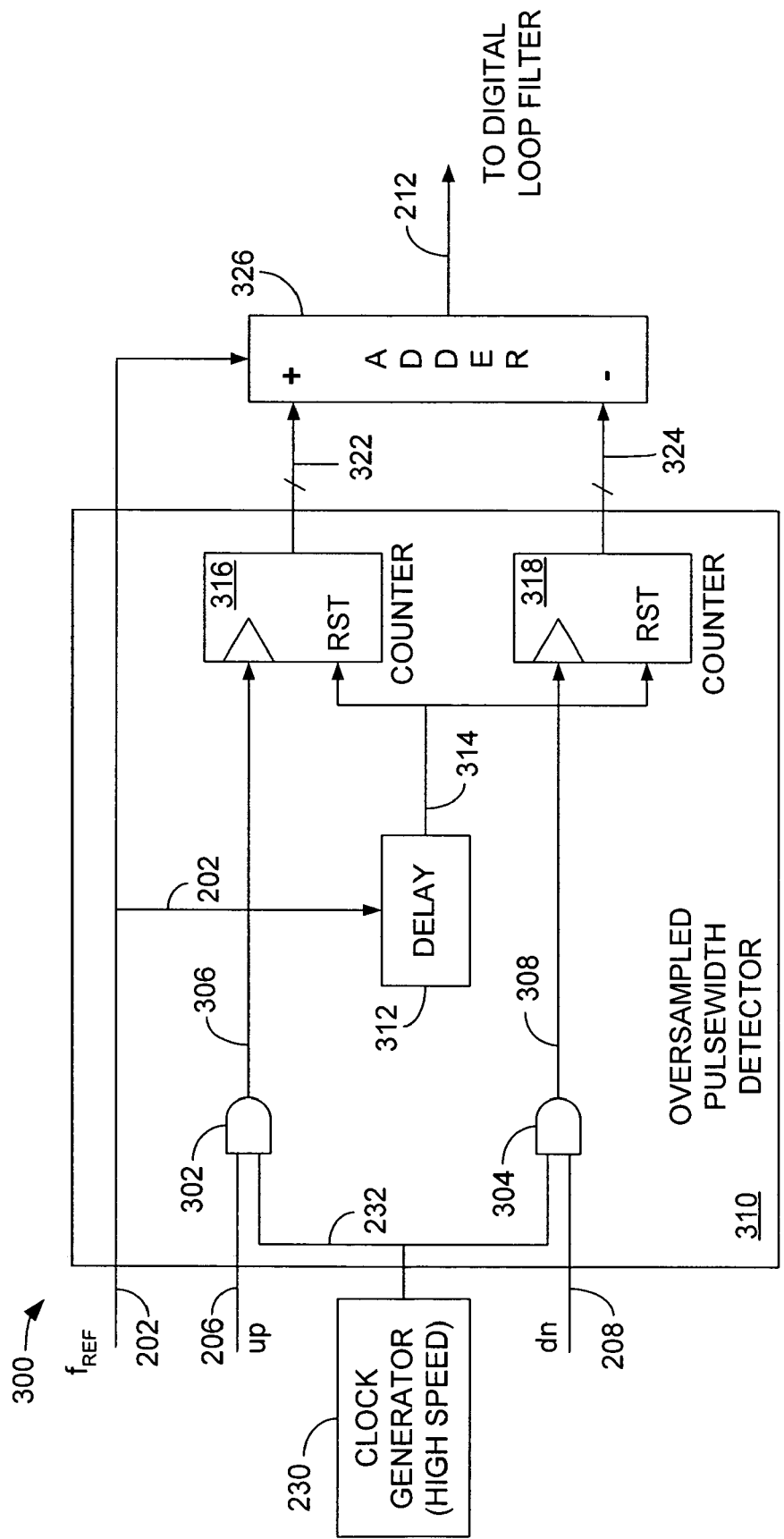
FIG. 3 is a block diagram illustrating an embodiment of the up/down counter of FIG. 2.

FIG. 3 is a block diagram illustrating an embodiment of the up/down counter 300 of FIG. 2. The up/down counter 300 is implemented in FIG. 3 as an over-sampled pulsewidth detector (OSPD) 310. The up signal on connection 206 is supplied to a first input of AND gate 302 while the down signal on connection 208 is supplied to a first input of AND gate 304. The clock signal supplied by the clock generator 230 on connection 232 is supplied to the second inputs of AND gates 302 and 304. A reference frequency signal $f_{REF}$ is supplied via connection 202 to a delay element 312 and to an adder 326. In this embodiment, the frequency of the signal on connection 232 is 8 times (8×) the frequency of the reference frequency $f_{REF}$.

The output of AND gate 302 is supplied via connection 306 to a counter 316 and the output of AND gate 304 is supplied via connection 308 to a counter 318. The output of the delay element 312 is supplied via connection 314 to the reset inputs of counter 316 and 318. The delay element 312 delays the reset signal and ensures that the data in the counters 316 and 318 is read out before the counters are reset.

The output of the counter 316 is supplied via connection 322 to a first input of the adder 326 and the output of the counter 318 is supplied via connection 324 to a second input of the adder 326. The adder 326 combines the signals on connections 322 and 324 and provides a digital bit stream on connection 212 to the digital loop filter 214 (FIG. 2). The OSPD 310 counts the number of up and down signals that occur over one operating cycle and detects small errors between the up and down signals. The OSPD 310 quantizes the phase error represented by the up and down signals on connections 206 and 208. The clock frequency is a multiple integer number of the reference frequency ($f_{REF}$) on connection 202 to minimize quantization error, thus maximizing the accuracy of the signal information that may occur between the difference of the output of the sigma-delta modulator 242 (to be described below) and the reference frequency ($f_{REF}$).

Figure 4A:
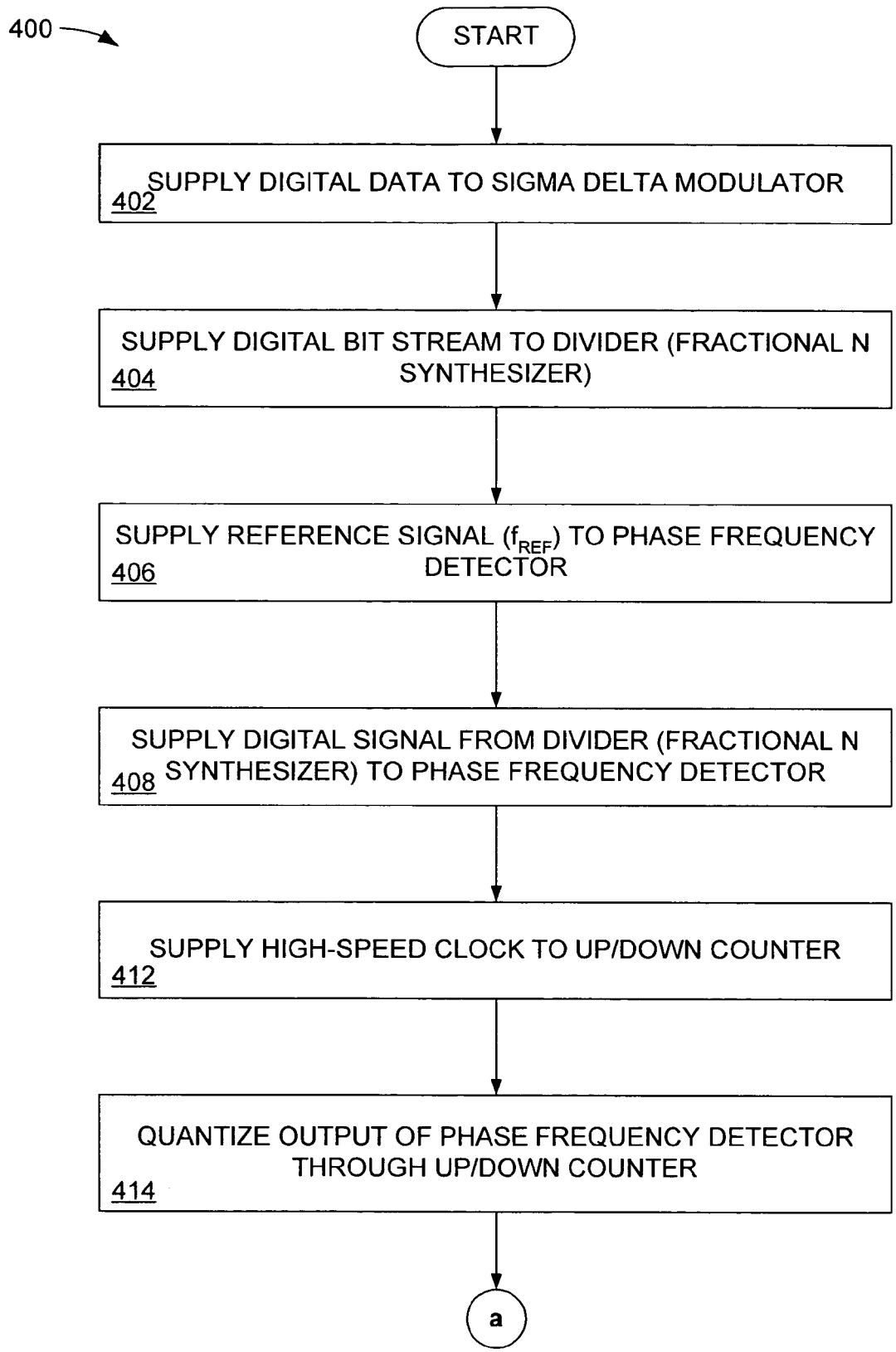
FIGS. 4A and 4B are a flow chart collectively describing the operation of one embodiment of the direct modulator.
Figure 4B:
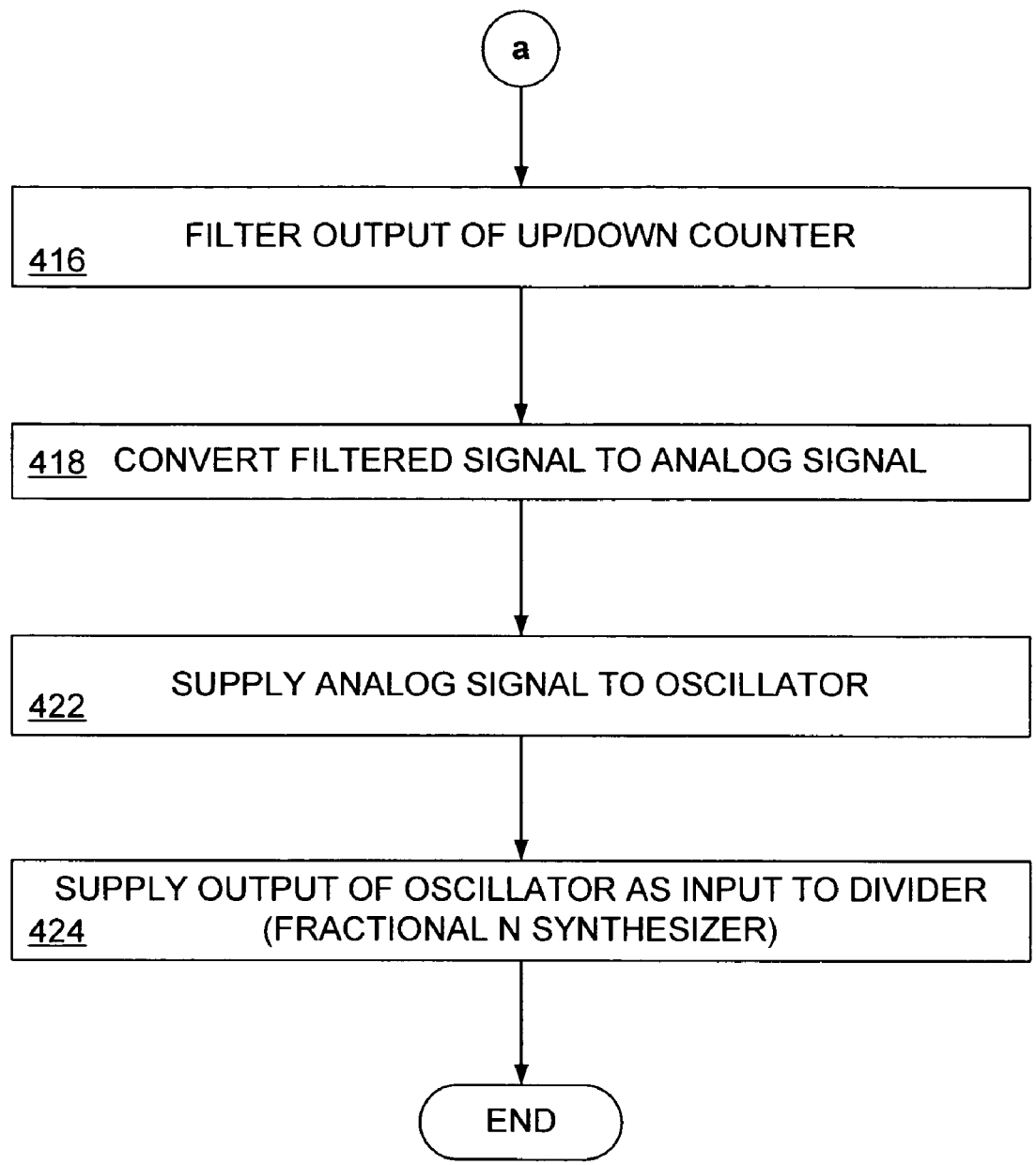

FIGS. 4A and 4B are a flow chart 400 collectively illustrating the operation of one embodiment of the direct modulator. The flow chart of FIG. 4 describes the operation of one embodiment of the direct modulator. Further, the blocks in the flow chart need not be performed in the order shown. The blocks may be performed in different order or may be performed simultaneously. In block 402 digital data is supplied from the DSP 126 to the sigma-delta modulator 242 (FIG. 2). The sigma-delta modulator 242 generates a randomized bit stream including the data to be transmitted. In block 404 the digital bit stream from the sigma-delta modulator 242 is supplied to the divider 334. The divider 234 combines the randomized digital value from the sigma-delta modulator 242 with a nominal value (N). In block 406 a reference signal $f_{REF}$ is supplied to the phase frequency detector 204.

In block 408, the digital output of the divider 234 is supplied to the phase frequency detector 204. In block 412, a clock signal is supplied from the clock generator 230 to OSPD 310. The clock signal is at a frequency that is, a multiple integer number of the reference signal $f_{REF}$. In block 414, the output of the phase frequency detector is quantized through the OSPD 310.

In block 416, the output of the up/down counter (OSDP) 300 is filtered to stabilize the phase locked loop 260. In block 418 the output of the digital loop filter 214 is converted to an analog signal. In block 422 the analog signal is supplied to the oscillator 224, and in block 424, the output of the oscillator 224 is supplied to the divider 234. The output of the divider 234 includes the transmit data from the DSP 126 and is a feedback signal that determines the operating frequency of the direct modulator 200. By modifying the output of the sigma-delta modulator 242 to include the transmit data, the transmit data is present on the feedback signal on connection 236 and is impressed on the RF transmit signal at the oscillator 224.

While various embodiments of the invention have been described, it will be apparent to those of ordinary skill in the art that many more embodiments and implementations are possible that are within the scope of this invention. Accordingly, the invention is not to be restricted except in light of the following claims and their equivalents.

What is claimed is:

1. A system for direct modulation, comprising:
   a phase frequency detector configured to determine a phase/frequency difference between a reference signal and a feedback signal and provide output signals;
   a counter configured to combine the output signals into a first digital signal;
   a digital to analog converter configured to convert the first digital signal to an analog signal;
   an oscillator configured to upconvert the analog signal to a radio frequency (RF) signal; and
   a modulator configured to modulate a data signal and supply a second digital signal.

2. The system of claim 1, further comprising a divider configured to combine the RF signal with the second digital signal, and supply the feedback signal to the phase frequency detector.

3. The system of claim 2, wherein the counter further comprises:
   an oversampled pulsewidth detector configured to provide the first digital signal.

4. The system of claim 2, wherein the modulator receives digital transmit data.

5. The system of claim 4, wherein the modulator is a sigma-delta modulator.

6. The system of claim 3, wherein the oversampled pulsewidth detector further comprises circuitry configured to determine a phase and frequency error between the output signals.

7. The system of claim 6, wherein the circuitry further comprises a pair of AND gates and a pair of counters, the AND gates configured to add one of the output signals with an oversampled frequency signal.

8. The system of claim 7, wherein the circuitry further comprises an adder configured to add the outputs of the counters and quantize a phase error between the output signals.

9. A method for direct modulation, comprising:
   supplying digital transmit data to a modulator;
   modifying an output of the modulator;
   supplying the output of the modulator to a divider;
   modifying an output of the divider using the output of the modulator, thereby impressing the digital transmit data on a radio frequency (RF) signal using the output of the modulator;
   impressing the digital transmit data on an oscillator;
   determining a phase/frequency error between a reference signal and a feedback signal;

quantizing the phase/frequency error; and using the quantized phase/frequency error to determine a transmit frequency of the oscillator.

10. The method of claim 9, wherein the quantizing further comprises sampling the phase/frequency error at a frequency higher than the frequency of the reference signal.

11. The method of claim 10, further comprising sampling the phase/frequency error at a frequency eight (8) times higher than the frequency of the reference signal.

12. The method of claim 9, further comprising modifying the output of the modulator using transmit data.

13. The method of claim 9, further comprising modifying the output of the divider using a digital signal representing a fraction of a reference value.

14. A modulation method, comprising:

impressing baseband data on a radio frequency (RF) signal at an oscillator by controlling a digital divider using a sigma-delta modulator;

determining a frequency of the oscillator by detecting a phase/frequency error between a reference signal and a feedback signal provided by the divider; and quantizing the phase/frequency error.

15. The method of claim 14, further comprising randomizing the output of the sigma-delta modulator using baseband data.

16. The method of claim 14, further comprising modifying an output of the digital divider using the randomized output of the sigma-delta modulator.

17. The method of claim 14, wherein the quantizing further comprises sampling the phase/frequency error at a frequency higher than the frequency of the reference signal.

18. The method of claim 17, further comprising sampling the phase error at a frequency eight (8) times higher than the frequency of the reference signal.

19. A modulation system, comprising:

means for impressing baseband data on a radio frequency (RF) signal at an oscillator by controlling a digital divider using a sigma-delta modulator;

means for determining a frequency of the oscillator by detecting a phase/frequency error between a reference signal and a feedback signal provided by the divider; and means for quantizing the phase/frequency error.

20. The system of claim 19, further comprising means for randomizing the output of the sigma-delta modulator using baseband data.

21. The system of claim 19, further comprising means for modifying an output of the digital divider using the randomized output of the sigma-delta modulator.

22. The system of claim 19, wherein the quantizing further comprises means for sampling the phase/frequency error at a frequency higher than the frequency of the reference signal.

23. The system of claim 22, further comprising means for sampling the phase/frequency error at a frequency eight (8) times higher than the frequency of the reference signal.

* * * * *